United States Patent [19]
Gu et al.

[11] Patent Number: 5,525,916
[45] Date of Patent: Jun. 11, 1996

[54] ALL-N-LOGIC HIGH-SPEED SINGLE-PHASE DYNAMIC CMOS LOGIC

[75] Inventors: Richard Gu; Mohamed Elmasry, both of Waterloo, Canada

[73] Assignee: The University of Waterloo, Waterloo, Canada

[21] Appl. No.: 419,376

[22] Filed: Apr. 10, 1995

[51] Int. Cl.$^6$ .................. H03K 19/096; H03K 19/0948
[52] U.S. Cl. ........................... 326/98; 326/121; 326/17
[58] Field of Search .................. 326/93, 95, 98, 326/112, 119, 121, 17

[56] References Cited

U.S. PATENT DOCUMENTS

| | | | |
|---|---|---|---|
| 4,841,174 | 6/1989 | Chung et al. | 326/94 |
| 4,851,714 | 7/1989 | Hwang | 326/98 |
| 5,291,076 | 3/1994 | Bridges et al. | 326/95 |

OTHER PUBLICATIONS

Gu et al., "An All-N-Logic High-Speed Single-Phase Dynamic CMOS Logic", *International Supplement of Circuits and Systems ISCAS)*, pp. 7-10 (May 1994).

Krambeck et al., "High-Speed Compact Circuits with CMOS", *IEEE Journal of Solid-State Circuits*, 17, No. 3, pp. 614-619, (Jun. 1982).

Goncalves et al., "NORA A Racefree Dynamic CMOS Technique for Pipelined Logic Structures", *IEEE Journal of Solid-State Circuits*, 18, No. 3, pp. 261-266, (Jun. 1983).

Yuan et al., "High-Speed CMOS Circuit Technique", *IEEE Journal of Solid-State Circuits*, 24, No. 1, pp. 62-70, (Feb. 1989).

Lee et al., "Zipper CMOS", *IEEE Circuits and Devices Magazine*, pp. 10-16 (May 1986).

Wu et al., "Analysis and Design of a New Race-Free Four-Phase CMOS Logic", *IEEE Journal of Solid-State Circuits*, 28, No. 1, pp. 18-25, (Jan. 1993).

Shoji, "Scaling of the NFET Chain", *CMOS Digital Circuit Technology*, pp. 243-245, 1988.

Primary Examiner—Edward P. Westin
Assistant Examiner—Jon Santamauro
Attorney, Agent, or Firm—Schwegman, Lundberg, Woessner, & Kluth

[57] ABSTRACT

An All-N-Logic (ANL) high-speed single-phase dynamic CMOS logic utilizing all-N-logic blocks. According to a first embodiment, a 2:1 frequency divider is provided using the ANL CMOS logic of the present invention. According to a second embodiment, a pipelines 8-bit carry generator is provided utilizing five stacked NMOS gates.

13 Claims, 12 Drawing Sheets

N1-block (noninverting)

OUT ——
Clock ·····

ALL-N-LOGIC HIGH-SPEED SINGLE-PHASE DYNAMIC CMOS LOGIC

FIELD OF THE INVENTION

This invention relates in general to high speed CMOS dynamic circuits, and more particularly to VLSI circuits implemented using an all-N-logic (ANL) high-speed single-phase dynamic CMOS logic.

BACKGROUND OF THE INVENTION

CMOS dynamic circuits are widely used in VLSI design when high speed operation is required. However, CMOS dynamic circuits suffer from problems relating to race, clock skew and slew rate, charge redistribution, and DC power consumption. One type of CMOS logic, referred to herein as "Domino", is disclosed in R. H. Karambeck, C. M. Lee, H-S. Law, "High-speed Compact Circuits with CMOS," IEEE I. Solid-State Circuits, Vol. 17, pp. 614–619, June 1982. The Domino CMOS logic suffers from a significant disadvantage in that it is non-inverting.

Another prior art CMOS logic is disclosed in N. F. Goncalves and H. J. De Man, "NORA: A Race-free Dynamic CMOS Technology for Pipelined Logic Structures" IEEE J. Solid-State Circuits, Vol-18, pp.261–266, June 1983. Both NORA and Domino CMOS logic suffer from charge redistribution problems.

Further prior art CMOS logic designs are described in J. Yuan and C. Svensson, "High-speed CMOS Circuit Technique", IEEE J. Solid-State Circuits, Vol-24, pp. 62–70, February 1989 and C. M. Lee, and E. W. Szeto, "Zipper CMOS", IEEE Circuits Devices Mag., pp 10–16, May 1986. Each of the NORA, single phase design of Yaun et al and the Zipper CMOS methodology require the use of low-speed P-Logic blocks. Furthermore, the Zipper CMOS consumes DC power and requires a proprietary Zipper driver.

Yet another prior art CMOS logic is disclosed in C. Y. Wu. K. H. Cheng and J. S. Wang, "Analysis and Design of a New Race-free Four-phase CMOS Logic", IEEE J. Solid-State Circuits, Vol. 28, pp. 18–25, January 1993. This four-phase dynamic logic also consumes DC power and requires a complicated clock distribution system.

SUMMARY OF THE INVENTION

According to the present invention, a new high speed all-N-logic single-phase dynamic CMOS logic (ANL CMOS) is provided. One embodiment of applicants' invention is disclosed in R. X Gu and M. I. Elmasry, "An All-N-Logic High-Speed Single-Phase Dynamic CMOS Logic", Proc. ISCAS, Vol. 4, pp7–10, London, England, May 1994. As will be discussed in greater detail below, the ANL CMOS design of the present invention overcomes the problems of prior art CMOS logic by eliminating the need for low-speed P-Logic blocks. The use of all-N-logic results in speed improvements in the order of 2 to 3 times the speed of conventional CMOS dynamic circuits.

According to a first embodiment of the present invention, a 2:1 frequency divider is provided, using the ANL CMOS logic of the present invention, implemented in 0.8 μm CMOS technology and operating with a clock frequency as high as 1.5 GHz. According to a second embodiment, a pipelined 8-bit carry generator is provided utilizing five-stacked NMOS gates for the N-logic portion, which operates at a clock rate of over 710 MHz.

BRIEF DESCRIPTION OF THE DRAWINGS

A detailed description of various embodiments of the invention, and a comparison with prior art CMOS dynamic circuits, is provided herein below with reference to the following drawings, in which.

DETAILED DESCRIPTION OF THE PREFERRED EMBODIMENT AND OF THE PRIOR ART

The prior art NORA dynamic CMOS technique discussed above uses a true two-phase clock signal instead of a four-phase clock signal in order to overcome the race problem caused by clock skew. According to the prior art NORA pipeline system, N- and P-C'MOS latches are alternately used.

However, the successful application of CMOS dynamic circuits requires the use of a minimum number of clock signals. For example, FIG. 1 shows the CMOS dynamic circuit of Yuan et al which uses a single-phase clock signal (CL) which is not inverted. Since only a single-phase clock signal is utilized, no clock skew exists and a higher clock frequency can be used than with prior art two-phase and four-phase clock signal designs. Thus, single-phase CMOS circuits can complement static CMOS, and in most cases, can replace NORA logic, since the single-phase CMOS circuits are faster than NORA circuits.

Figure 1A:
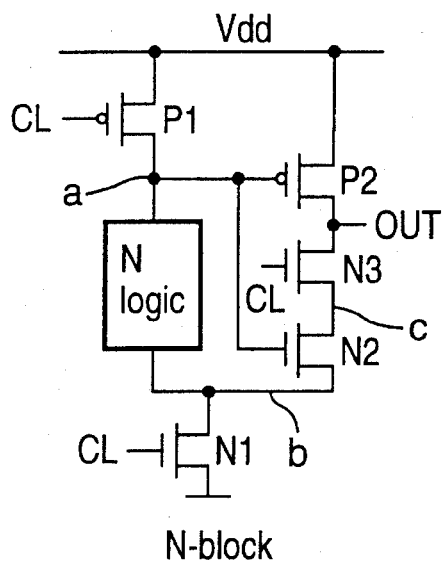
FIG. 1, which comprises parts a, b and c, is a circuit schematic diagram and clock signal diagram of a prior art single-phase CMOS dynamic circuit.
Figure 1B:
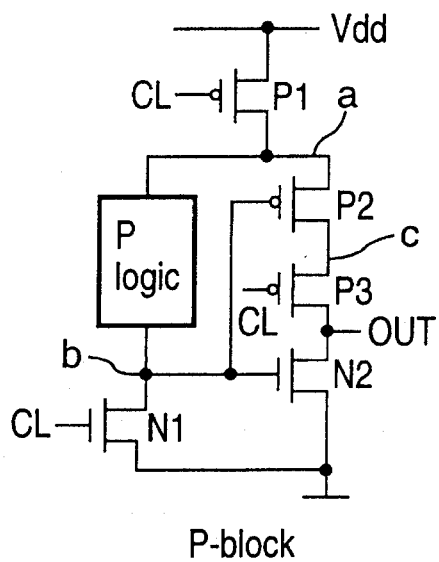
Figure 1C:
Figure 2:
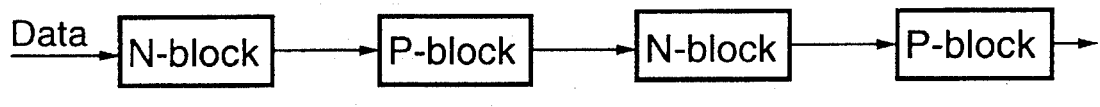
FIG. 2 is a schematic block diagram of a pipeline system according to prior art CMOS designs.

As shown in FIG. 2, both NORA circuits and the prior art single-phase CMOS circuits of FIG. 1 are used to implement a pipelined structure, by successively alternating N-logic and P-logic blocks. The use of low-speed P-logic blocks in these prior art designs limits the applied clock frequency (i.e. due to the slow precharging and discharging time of the P-logic blocks). Thus, the advantage of using the fast N-logic blocks is not fully utilized in these prior art designs.

Figure 3A:
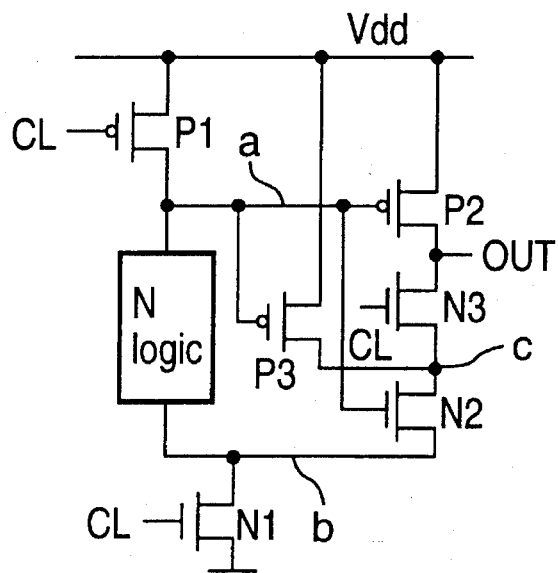
FIG. 3, which comprises parts a, b and c, shows a circuit schematic and clock signal diagram for the all-N-logic (ANL1) single-phase CMOS dynamic circuit according to a first embodiment of the present invention.
Figure 3B:
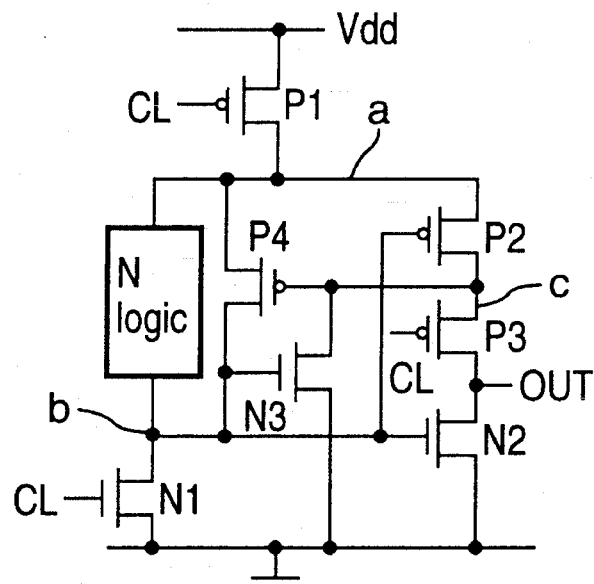
Figure 3C:

Turning now to FIG. 3, a pair of all-N-logic (ANL1) circuits are shown for use in a pipeline system. The N1-block (FIG. 3a) is a revised version of the N-block of FIG. 1a. The logic operation of the N1-block circuit in FIG. 3 is non-inverting. The operating principles of the N1-block are as follows: When "CL" is "0", PMOS transistor P1 is ON, node "a" is "HIGH", and PMOS transistor P2 is shut OFF. Because NMOS transistor N3 is OFF, the output node "OUT" holds its previous state. When "CL" is "1", NMOS transistors N1 and N3 are ON, and node "b" is discharged to ground. If the "N-logic" block is "1", node "a" is also discharged to ground and node "OUT" is "1". If the "N-logic" block is "0", node "a" remains "HIGH" and causes the signal at node "OUT" to fall to ground.

For the purpose of this disclosure the terms "N-logic" and "P-Logic" denote conventional logic functions (e.g. AND, OR, NAND, NOR, NOT), implemented using NMOS and PMOS transistors, respectively, In FIGS. 1, 3, 6 and 7, the logic functions provided by the "N-logic" and "P-logic" blocks are not specified, but may be any of the above-mentioned conventional functions.

The prior art circuit in FIG. 1a suffers from charge redistribution problems in the evaluating/holding blocks if the clock transition is not very short. More particularly, when "CL" is "1" and "N-logic" is "1", node "a" is discharged to "0" and node "OUT" rises to "HIGH". In this case, NMOS transistor N3 of FIG. 1a is turned ON, first strongly, then weakly, so that node "c" takes a long time to reach a voltage of "$V_{DD}-V_{th}$". For a high clock frequency, node "c" can only reach approximately 2.5 V. Thus, it is clear that the signals at the node "OUT" and the node "c" are at different voltage levels when the evaluating period ends. When "CL" switches from "1" to "0" and the clock slew rate is longer than 5 V/2.5 ns, NMOS transistor N3 of FIG. 1a does not totally shut OFF, and the voltage at node "OUT" goes low, due to charge redistribution, and thus the noise margin and speed are reduced.

This disadvantage is overcome in the present invention by adding one PMOS transistor P3 as shown in FIG. 3a. When "CL" is "1", and "N-logic" is "1", node "a" is "LOW" and node "OUT" is "HIGH", PMOS transistor P3 is ON which causes node "c" to charge to "$V_{DD}$". Hence the signals at node "OUT" and at node "c" are at the same voltage level. Thus, when the clock signal switches, no charge redistribution occurs. Testing has shown that the circuit of the present invention operates correctly at any clock skew rate.

Figure 4:
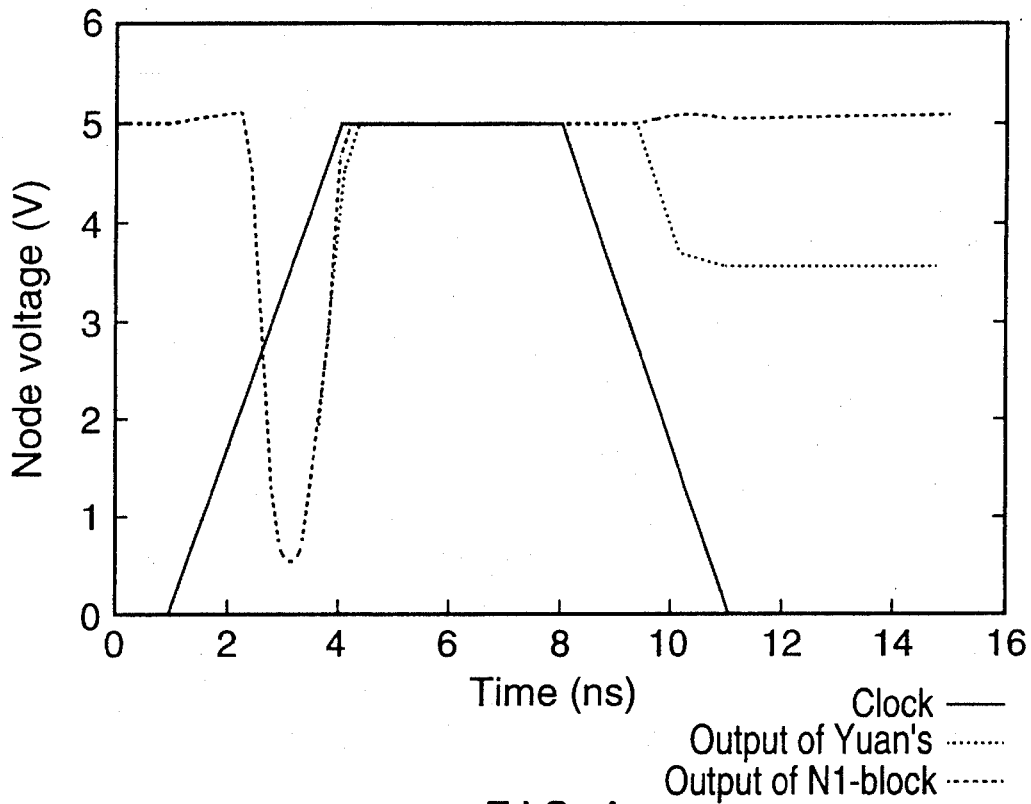
FIG. 4 is a graph comparing the output voltage levels for the prior art CMOS dynamic circuit of FIG. 1 and the ANL1 CMOS dynamic circuit of FIG. 3 at a clock slew rate of 5 V/3 ns when all inputs are "1"

FIG. 4 shows a comparison of the output nodes of the two circuits of FIGS. 1a and 3a at a clock slew rate of 1.67 V/ns. It is clear from FIG. 4 that the prior art Yuan circuit does not hold the output level at 5 V whereas the N1-block of FIG. 3a is capable of sustaining the output level at 5 V. Another advantage of using PMOS transistor P3 is that it speeds up the charging process as shown in FIG. 4.

In a pipeline system, the N-block and P-block are alternately used due to their complementary evaluating and holding periods, thereby resulting in race free operation. In order to achieve high operating frequency, the number of PMOS transistors are minimized in the low speed P-logic devices, and in most cases, the p-logic blocks are used only as a latch. Thus, most logic operations are carried out in the N-block and a half clock cycle is wasted, such that a longer pipeline is needed, resulting in slower operating speed.

Figure 5:
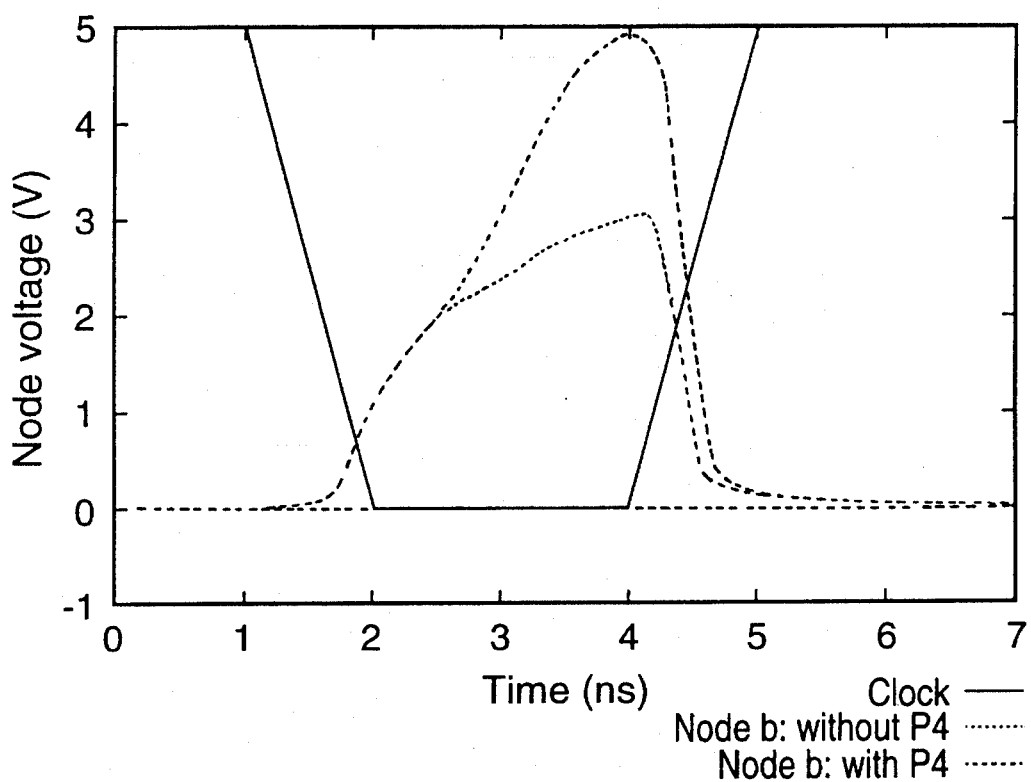
FIG. 5 is a graph comparing node voltage levels for the prior art circuit of FIG. 1 and the circuit of FIG. 3 when all inputs are "1"

For the N-logic block of FIG. 3, the logic output is normally from node "a" since node "a" is a full-swing node, whereas node "b" is only a half-swing node. However, by converting node "b" to a full-swing node, all N-logic operations can be accomplished. Based on the above considerations, an N2-block is provided as shown in FIG. 3b, which is the complementary circuit of the N1-block of FIG. 3a. The operating principle of the N2-block is as follows: When "CL" is "1", NMOS transistor N1 is ON, node "b" is "LOW", and NMOS transistor N2 is OFF. Because the PMOS transistor P4 is OFF, the output node "OUT" holds its previous state. When "CL" is "0", PMOS transistors P1 and P4 are ON, and node "a" is "HIGH". If the "N-logic" block is "1", node "b" is charged to "HIGH" and node "OUT" is discharged to ground. "N-logic" is "0", node "b" remains "LOW" and causes node "OUT" to charge to "HIGH". However, when the N-logic block is "1" and "CL" is "0", node "b" quickly goes to 2 V and slowly goes from 2 V to "$V_{DD}-V_{th}$", which is equal to 3.5 V if the body effect is active. For high speed operation, the voltage on node "b" can go only rise to about 2.5 V. Hence, it is difficult to extract logic signals from node "b" by a CMOS inverter (see FIG. 5). Therefore, according to the present invention, a positive feedback PMOS transistor P4 is provided to make the voltage on node "b" quickly rise to $V_{DD}$, if necessary. Thus, a half-logic swing becomes a logic swing at node "b". FIG. 5 shows that a full logic swing is obtained using PMOS transistor P4. The ratio of the inverter comprising transistors P2 and N2 should preferably be designed so that $W_{P2}/W_{N2}<1.5$ so that the inverter switches when the voltage on node "b" passes through 2 V.

The purpose of using NMOS transistor N3 is to avoid charge redistribution. It is an essential feature of the present invention that all-N-logic be used in the pipeline embodiment of the present system. If the output node of the N2-block can not stay at 0 V in the holding period, the noise margin is reduced, and a fault logic can possibly occur. By using NMOS transistor N3 in the circuit as shown in FIG. 3b, if "CL" is "0", "N-logic" is "1", node "b" is "HIGH" and node "OUT" is "LOW", NMOS transistor N3 is open and causes node "c" to discharge to ground. Therefore, node "OUT" and node "c" are at the same voltage level. Thus, when the clock signal switches, the output node stays at 0 V during the holding period. The speed of this circuit is also improved by adding another discharging path; that of NMOS transistor N3. The logic operation of the N2-block circuit in FIG. 3b is inverting.

Figure 6A:
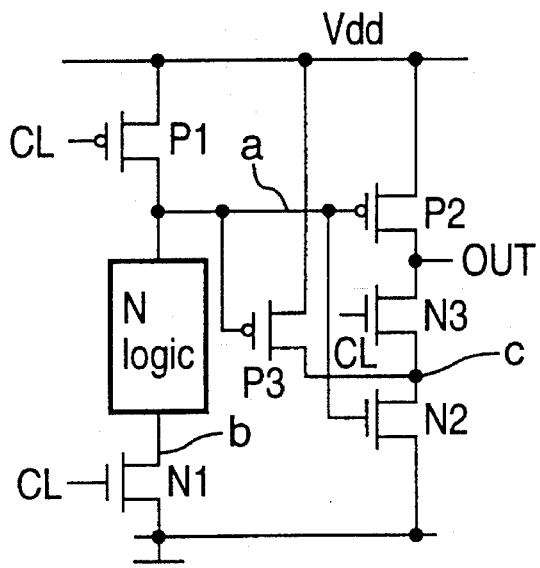
FIG. 6, which comprises parts a, b and c, forms a circuit schematic diagram and clock signal diagram for a second embodiment of the all-N-logic (ANL2) single phase CMOS dynamic circuit according to the present invention.
Figure 6B:
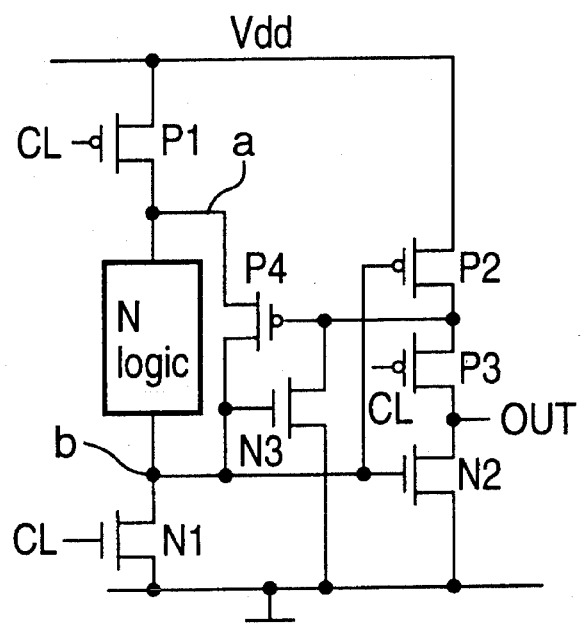
Figure 6C:
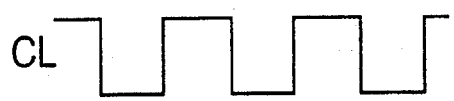
Figure 7A:
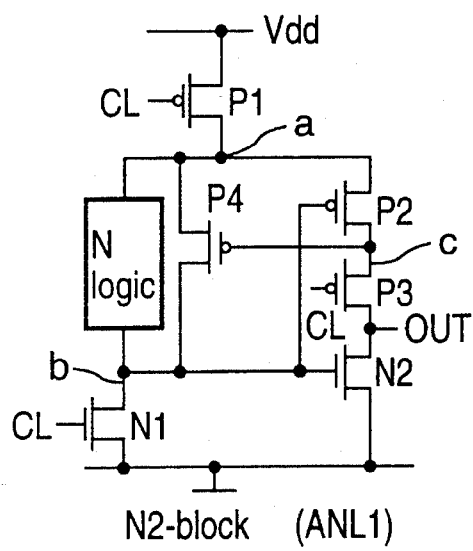
FIGS. 7a and 7b are circuit schematic diagrams of revised N2-blocks of the ANL1 and ANL2 embodiments of the present invention.
Figure 7B:
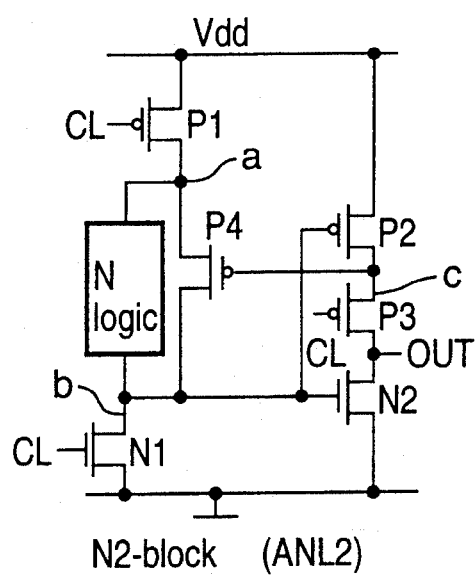

Another high speed version of the all-N-logic 2 (ANL2) circuitry of the present invention is shown in FIG. 6. This version of logic is faster than the ANL1 embodiment under operating conditions of sharper clock slew rate. In this embodiment, the output is charged or discharged by two PMOS or two NMOS transistors rather than three PMOS or three NMOS transistors. However, the clock slew rate must be higher than 1.6 V/ns. This means that the clock rise and fall time is 3 ns, in which case the clock hold time is at least equal to 5 ns. Thus, the circuits of FIGS. 6a and 6b can operate at a clock frequency of as low as 60 MHZ. From testing, it has been confirmed that the N1-block of the ANL2 embodiment of FIG. 6a has almost the same clock slew rate tolerance as the prior art N-block of FIG. 1a. However, the operating speed of the N1-block of the ANL2 embodiment is higher than the N-block of FIG. 1a. If the clock slew rate is high, NMOS transistors N3 of the N2-blocks of the ANL1 and ANL2 embodiments can be eliminated, as shown in FIG. 7.

Figure 8:
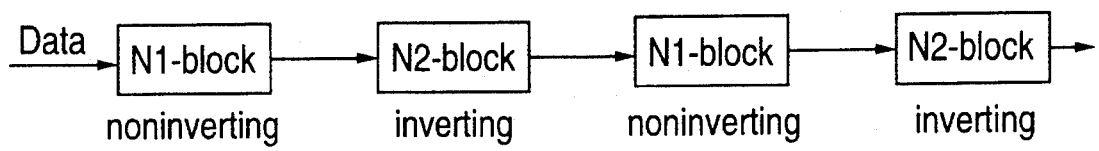
FIG. 8 shows a pipeline system for the all-N-logic single-phase CMOS circuit according to the present invention.

The pipeline system using the all-N-logic blocks of the present invention is shown in FIG. 8. The non-inverting N1-block and the inverting N2-block are connected in series, in alternating fashion.

Figure 9:
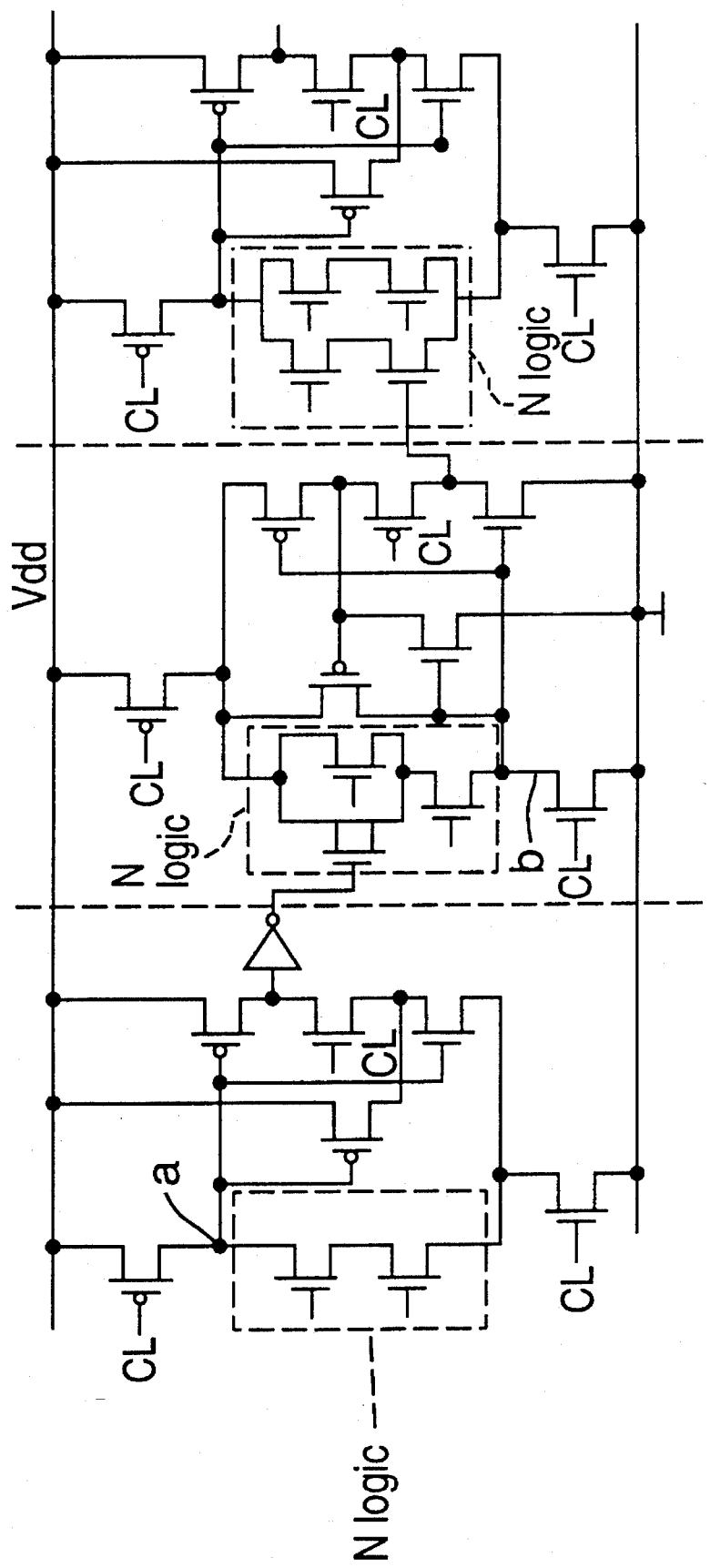
FIG. 9 is a schematic diagram of a pipeline of all-N-logic single-phase CMOS dynamic circuits according to the present invention.

A circuit example of a pipeline constructed using the N1-blocks and N2-blocks of the present invention is shown in FIG. 9. When "CL" is "0", node "a" of the non-inverting N1-block is charged to high, thus the N1-block is in the holding period and the inverting N2-block is in the evaluating period. When "CL" is "1", node "b" of the inverting N2-block is discharged and the N1-block is in the holding period, while the output is latched and stable, and the non-inverting N1-block is in the evaluating period. The alternative evaluating and holding periods ensure that the system operates race-free.

Static CMOS gates can be inserted between the N1-block and N2-block in the pipeline system of the present invention, provided the clock delay is less than the gate delay. As shown in FIG. 9, a CMOS inverter is used between the N1 and N2 blocks. Since the delay of the inverter is very small (i.e. negligible) the pipeline system of FIG. 9 can be implemented with all of the required logic operations with no seriously increased delay.

EXPERIMENTAL RESULTS

Circuit simulation of the circuits according to the present invention was carried out using an HSPICE simulator with a 0.8 μm CMOS technology parameter. The technology parameters are shown in Table 1, as follows:

TABLE 1

| NMOS | | PMOS | |
|---|---|---|---|
| Vtn | 0.78 V | Vtp | −0.88 V |
| Gate Oxide Thickness | 175Å | Gate Oxide Thickness | 175Å |
| Uo | 502 cm$^2$ V$^{-1}$ sec$^{-1}$ | Uo | 165 cm$^2$ V$^{-1}$ sec$^{-1}$ |
| Cgso | 273P F/m | Cgso | 215P F/m |
| Cgdo | 273P F/m | Cgdo | 215P F/m |
| Cj | 25w F/m | Cj | 450U F/m |
| Cjsw | 205P F/m | Cjsw | 212P F/m |

The trapezoidal scaling method was used for the MOS transistors using well known techniques (M. Shoji, "CMOS Digital Circuit Technology", Prentice Hall, 1988).

Figure 10:
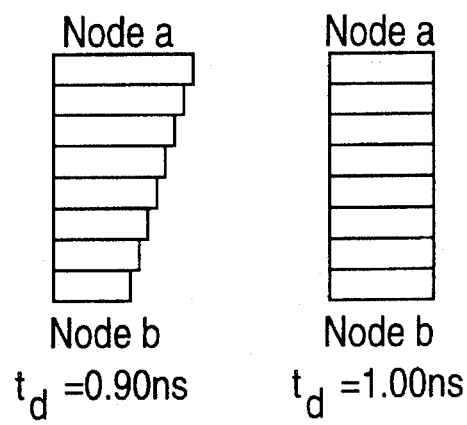
FIG. 10 is a schematic representation of the trapezoidal scaling of MOS devices for the P- and N2-blocks of the dynamic circuit according to the present invention.

The circuit simulation showed that there is no significant improvements for circuits evaluating at node "a", and that there is a 10% improvement for circuits evaluating at node "b" (see FIG. 10). Therefore, equal width for MOS transistors in logic blocks for circuits evaluating at node "a" and unequal width as shown in FIG. 10 for circuits evaluating at node "b" are used in the circuit simulation discussed herein below. The circuits can also operate in a ratioless case.

Figure 11:
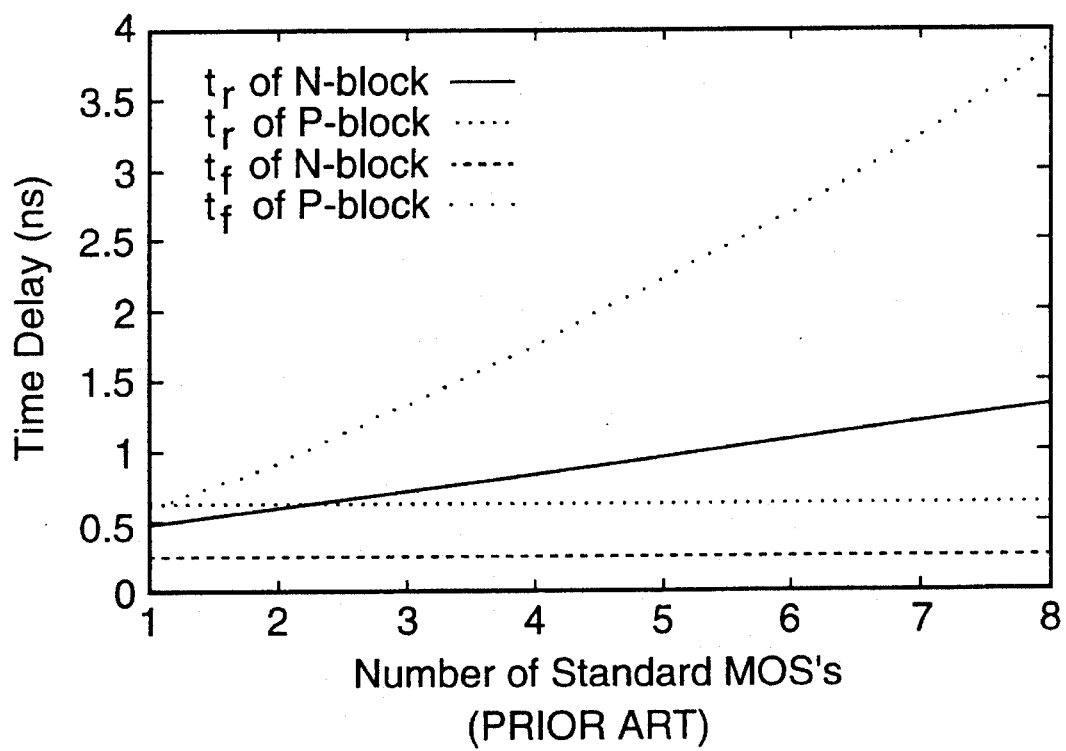
FIG. 11 is a graph showing the rise and fall time delay of the prior art circuit of FIG. 1 for different numbers of stacked MOS devices.
Figure 12:
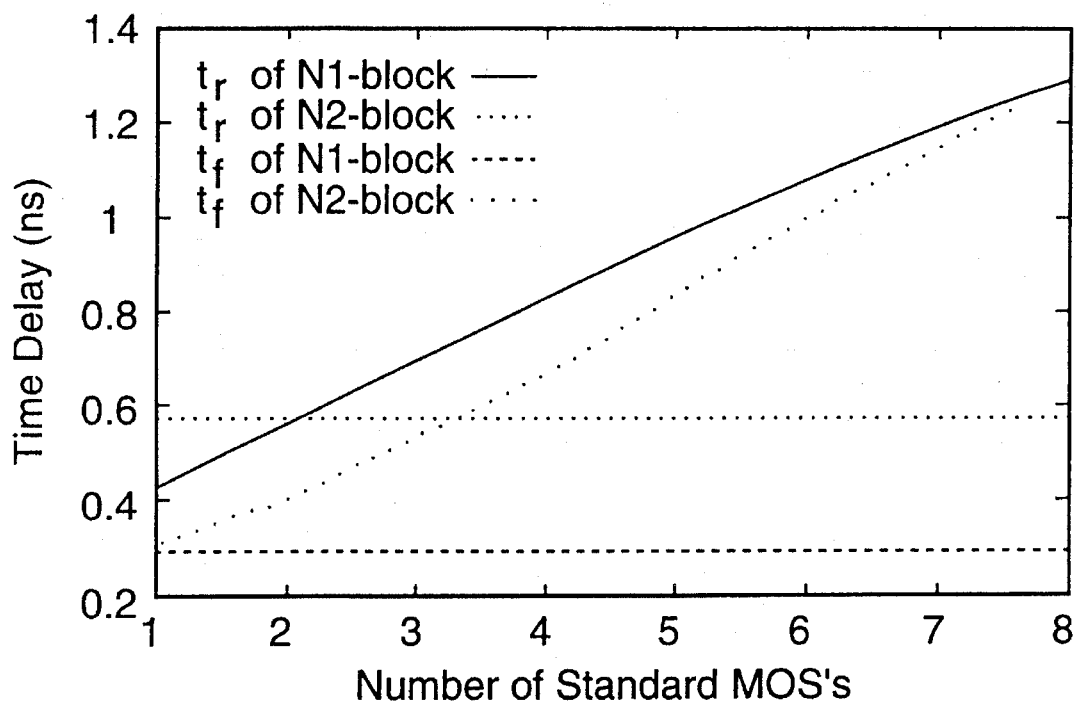
FIG. 12 is a graph showing the rise and fall time delay for the circuit of FIG. 3 for different numbers of stacked MOS devices.

A minimum size CMOS inverter is used at the output of the block circuits during testing. The worst case rise time at the output node for the circuits evaluating at node "a" is defined so that all of the intermediate nodes are charges to "HIGH" before they are discharged. Time delay $t_r$ is determined as the worst case rise time of the output node as it rises from 0 to 4.5 V. The worst case fall time at the output node for the circuits evaluating node "b" is defined so that all the intermediate nodes are discharged to "LOW" before they are charged. The delay $t_f$ is determined as the worst case fall time of the output node as it falls from 5 V to 0.5 V. HSPICE simulation results of the time delay versus number of stacked MOS transistors for the circuits of FIGS. 1 and 3 are shown in FIGS. 11 and 12, respectively. In FIGS. 11 and 12, the W/L ratios of transistors P2, P3 and N2 of the latched stages are set at $$\frac{8\,\mu m}{0.8\,\mu m}, \frac{8\,\mu m}{0.8\,\mu m} \text{ and } \frac{8\,\mu m}{0.8\,\mu m}$$

respectively. The purpose of PMOS transistor P3 of the N1-block and NMOS transistor N3 of the N2-block is to solve the charge sharing problem at node "c". Transistors P3 and N3, with a minimum size, can not charge or discharge node "c" efficiently. The W/L ratios of transistors P3 and N3 are chosen to be $$\frac{4\,\mu m}{0.8\,\mu m}.$$

For the same reason, the W/L ratios of transistor P4 of the N2-block are optimized as $$\frac{6\,\mu m}{0.8\,\mu m}$$

for charging node "b" quickly.

FIGS. 11 and 12 show that the rise times of the P-block of FIG. 1b and the N2-block of the ANL1 embodiments are constants. The P-logic of the P-block and N-logic of the N2-block are open circuits during the evaluating period ("CL" is "0"). Thus, node "b" remains "0", and the rise time is only determined by charging PMOS transistors P2 and P4. The number of stacked MOS transistors in the P- and N2-blocks does not affect the rise time delay. This is also the reason why the fall times of the N-block of FIG. 1a and the N1-block of the embodiment ANL1 are constants.

It is obvious that the slow P-block reduces the speed of the pipeline system by a factor of 2 to 3. The operating speeds of the N1- and N2-blocks are similar. Thus, the pipeline system for FIG. 9 alternatively using the N1- and N2-blocks operates race-free at a high clock rate without the requirement of a complementary P-block.

The maximum operating frequency of the pipeline systems shown in FIGS. 2 and 8 is defined as $$fmax = \frac{1}{2max(t_r, t_f)} \quad (1)$$

Figure 13:
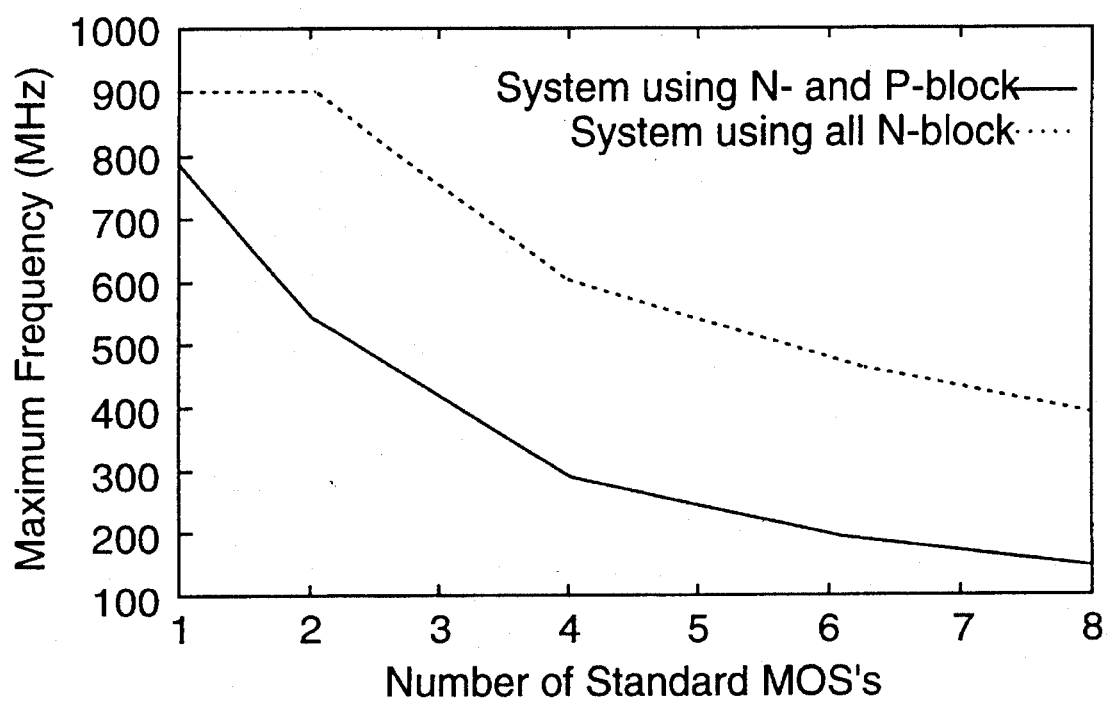
FIG. 13 compares the maximum operating frequency versus number of stacked MOS devices for the prior art using N- and P- blocks and the system of the present invention using all N- blocks.

FIG. 13 shows the maximum operating frequency of the two pipeline systems of FIGS. 2 and 8 versus the number of stacked MOS transistors based on FIGS. 11 and 12. The worst case operating speed of the N1- and N2- blocks are also similar. For the prior art NORA and Yuan circuits, the worst case operating speed is determined by the slow precharge and discharge of the P-logic. The advantage of using all-N-logic becomes increasingly significant when the number of stacked NMOS transistors exceeds two. Since the speed of the ANL1 and ANL2 circuits is 2–3 times faster than prior art circuits, the pipelined all-N-logic is 2–3 times faster than the pipelined N- and P-blocks, as verified by the HSPICE simulation results. The operating speed of the proposed pipelined circuits of the ANL1 blocks can reach 1.5 GHz.

As shown in FIGS. 12 and 13, the rise time delay of the N2-block is long because the output is charged through three PMOS transistors P1, P2 and P3. This limits the maximum operating frequency when the number of stacked NMOS transistors is equal to or less than two. By way of contrast, the ANL2 embodiment minimizes the rise delay, since the output of the N2-block of ANL2 (FIG. 6) is charged through only two series PMOS transistors P2 and P3. The circuit blocks can be further optimized by sizing the MOS transistors for different numbers of stacked MOS transistors. The optimization for the latch part of the circuit blocks is given as follows:

(a) Small load (fanout equal to or less than three inverters).

In this case, the driving capability is not a concern. For all the N1-blocks, the fall time is very small. Thus, the minimum size is chosen for NMOS transistors N2 and N3 and a large size is chosen for PMOS transistor P2. For the N2-block, with a small number of stacked NMOS transistors, the rise time delay is dominant. A large size for PMOS transistors P2 and P3 is used in order to quickly charge the output to "1". With a large number of stacked NMOS transistors, the fall time delay is dominant due to the slow charging at node "b". In order to reduce the fall time delay, a small size is chosen for PMOS transistors P2 and P3 in order to lower the switch point of the output-input transfer function of the inverter which is composed of transistors P2, P3, and N2. Thus, the minimum voltage at node "b" to pull the output voltage down is lower. Furthermore, this also reduces the parasitic capacitance at node "b". The optimized circuit parameters are as shown in Tables 2 and 3 for a fanout equal to one inverter. The rise and fall time delays are found to be similar for the N1- and N2-blocks.

TABLE 2

Optimized circuit parameters of the N1-block, $F_{out} = 1$

| No. of stacked MOS's | 1 | 2 | 4 | 6 | 8 |
|---|---|---|---|---|---|
| $W_{P2}(\mu m)$ | 10 | 10 | 10 | 10 | 10 |
| $W_{N2,N3}(\mu m)$ | 2.4 | 2.4 | 2.4 | 2.4 | 2.4 |
| $t_r(ns)$ | 0.31 | 0.42 | 0.64 | 0.91 | 1.17 |
| $t_f(ns)$ | 0.28 | 0.28 | 0.28 | 0.28 | 0.28 |

TABLE 3

Optimized circuit parameters of the N2-block, $F_{out} = 1$

| No. of stacked MOS's | 1 | 2 | 4 | 6 | 8 |
|---|---|---|---|---|---|
| $W_{P2,P3}(\mu m)$ | 10 | 8 | 6 | 4 | 3 |
| $W_{N2}(\mu m)$ | 8 | 10 | 12 | 12 | 12 |
| $t_r(ns)$ | 0.33 | 0.39 | 0.45 | 0.60 | 0.86 |
| $t_f(ns)$ | 0.335 | 0.42 | 0.62 | 0.86 | 1.03 |

(b) Large load (fanout equal to or greater than four inverters).

Figure 14:
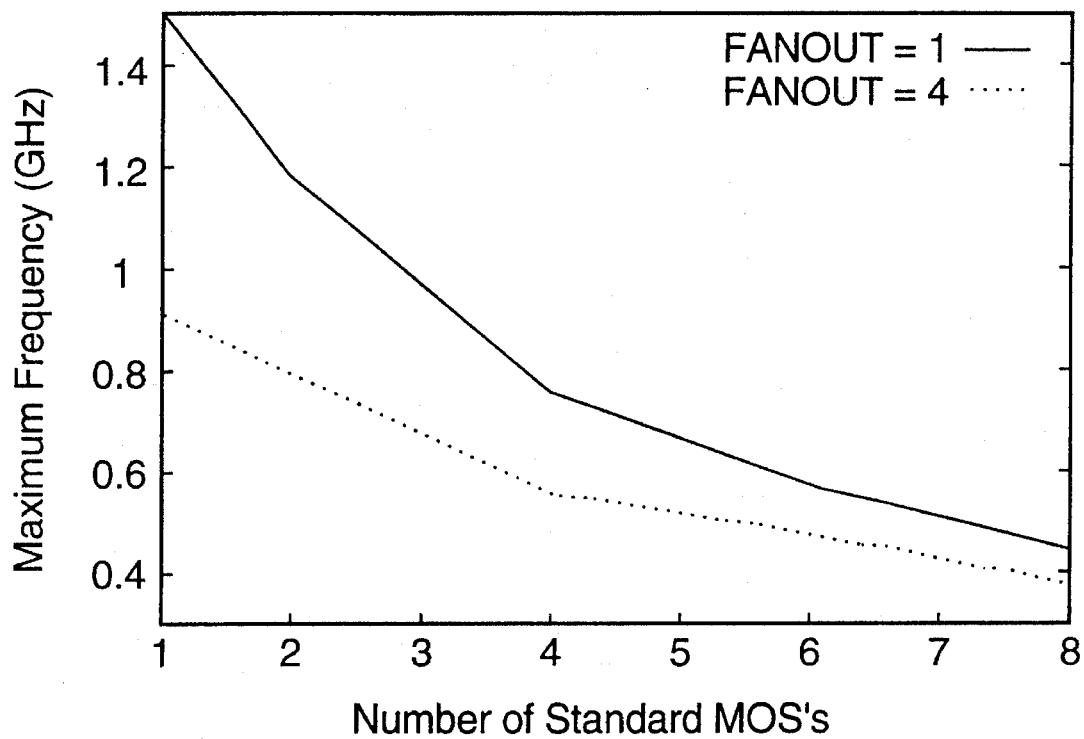
FIG. 14 is a graph showing the maximum operating frequency versus number of stacked MOS devices for the ANL2 embodiment of the present invention.

In this case, not only does the delay of the circuit blocks have to be minimized, but the driving capability must be considered. For the N1-block, small sized NMOS transistors N2 and P3 should be increased with the increase in the number of stacked MOS transistors. For the N2-block, with a large number of stacked NMOS transistors, if the fanout is equal to four inverters, the minimum size of $W_{P2,P3}$ should be 5 μm. The maximum operating frequency of the ANL2 embodiment, with different loads, is shown in FIG. 14. With fanout equal to 1, the maximum operating frequency can reach as high as 1.5 GHz for the pipelined system with the ANL2 blocks.

Figure 15:
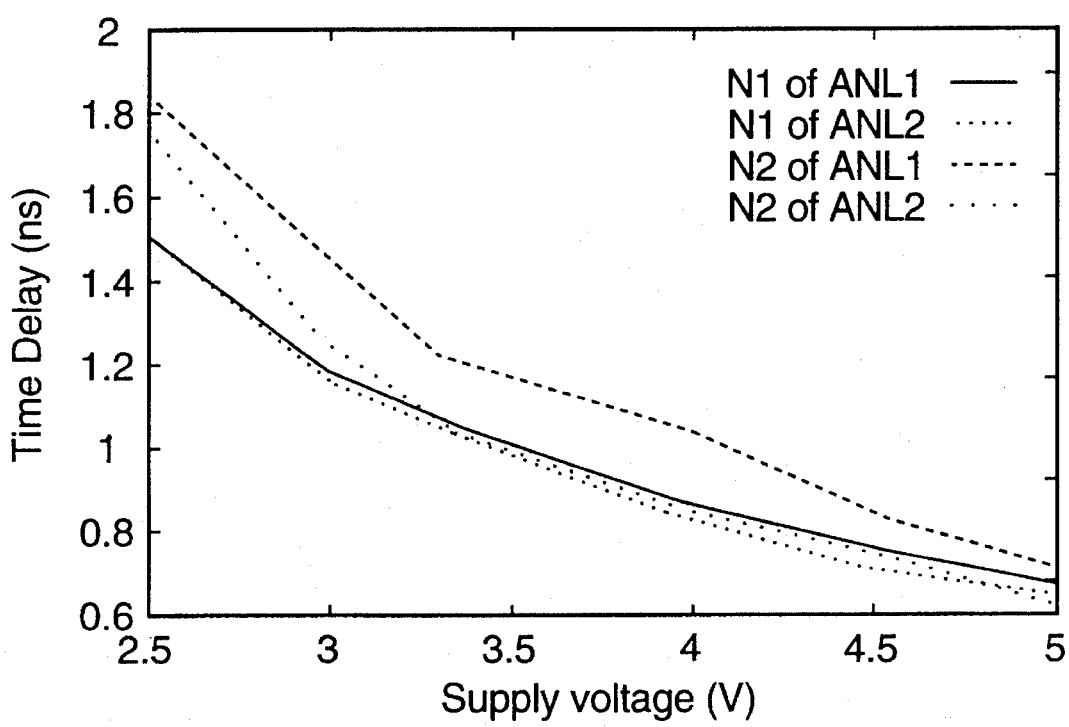
FIG. 15 is a graph showing delay versus supply voltage with four stacked MOS transistors and a fanout of 1, for the N1 and N2 blocks for the ANL1 and ANL2 embodiments of the present invention.

Dynamic circuits enhance the operating speed of digital systems due to their small parasitic capacitances. However, one main drawback of dynamic circuits is that they consume high power due to their high clock frequencies. The dynamic power of a circuit is given by:

$$P_d = C_L V^2_{dd} f_{op} \quad (2)$$

where $C_L$ is the load capacitance and $f_{op}$ is the operating frequency. The dynamic power is proportional to the square of the supply voltage V. Low supply voltage and low power are considered advantageous in modern VLSI technology. For dynamic circuits, if the power supply is scaled down, the dynamic power consumption can be greatly reduced. HSPICE simulations show that the proposed all-N-logic dynamic circuits of the present invention can operate well when the supply voltage is as low as 2.5 V. The relationship of delay versus supply voltage is shown in FIG. 15. Basically, the time delays of the ANL1 and ANL2 circuits increase by 70% when the supply voltage drops from 5 V to 3.3 V. At the same time, the dynamic power of the 5 V supply is four times higher than a 3.3 V supply considering the factor of lower operating frequency. The operating speed of all-N-logic dynamic systems at 3.3 V supply is 30% faster than the conventional latched dynamic systems at a 5 V supply. However, the power consumption of the ANL circuits is only half that of the conventional circuits.

EXEMPLARY EMBODIMENTS

Figure 16:
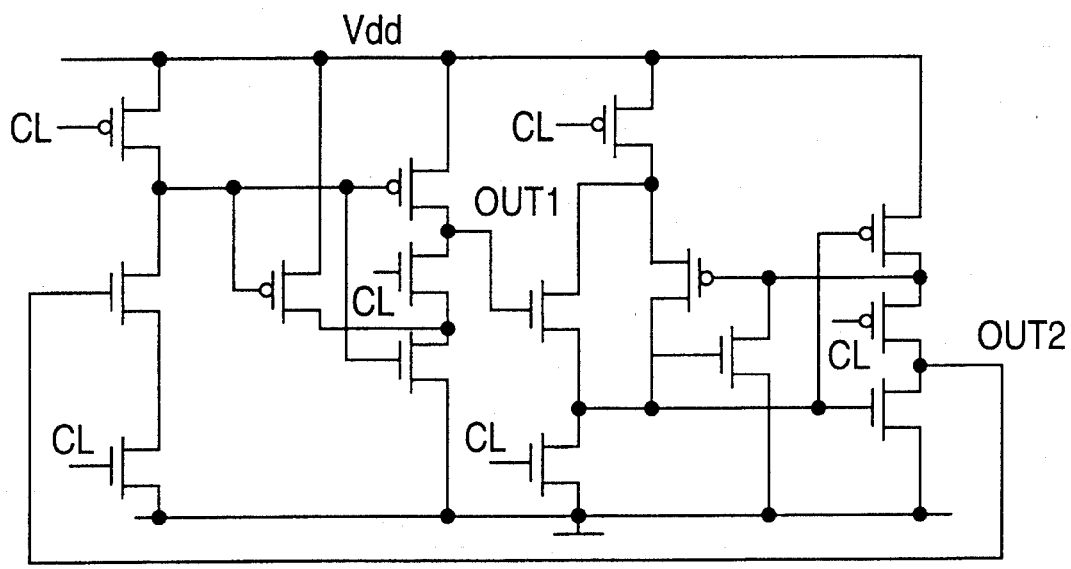
FIG. 16 is a circuit schematic diagram of a 2:1 frequency divider implemented using N1 and N2-blocks according to a first successful prototype implemented in accordance with the present invention.
Figure 17:
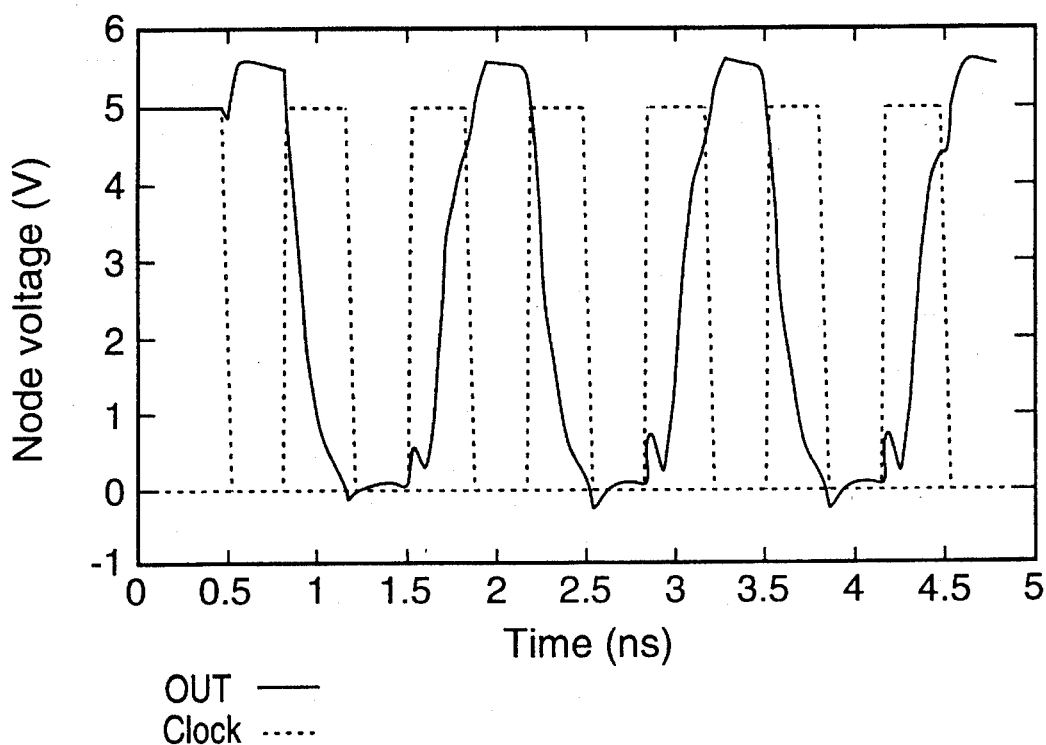
FIG. 17 is a graph showing output voltage levels for the 2:1 frequency divider of FIG. 16 at a clock frequency of 1.5 GHz.

Two circuits using the ANL2 embodiment have been designed and simulated using HSPICE. The first is a 2:1 frequency divider formed by the N1- and N2-blocks with one NMOS transistor in each N-logic block as shown in FIG. 16, wherein the clock signal is a step pulse. The output voltage signal shown in FIG. 17 indicates that the circuit can operate at a clock frequency of 1.5 GHz.

Figure 18:
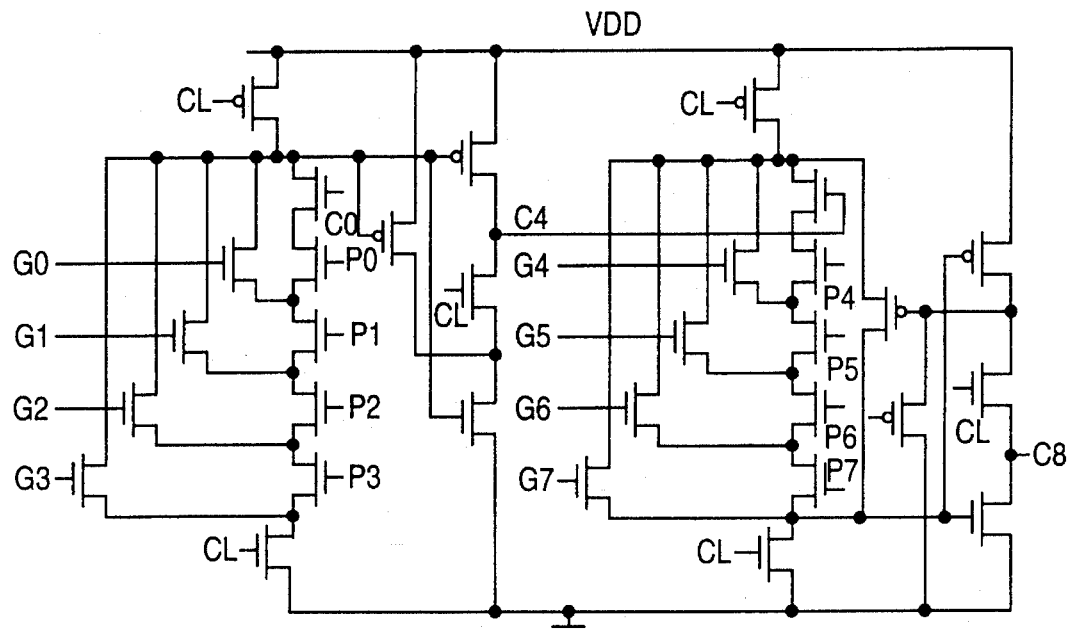
FIG. 18 is a circuit schematic diagram of an 8-bit carry generator implemented using the N1- and N2-blocks according to the present invention.
Figure 19:
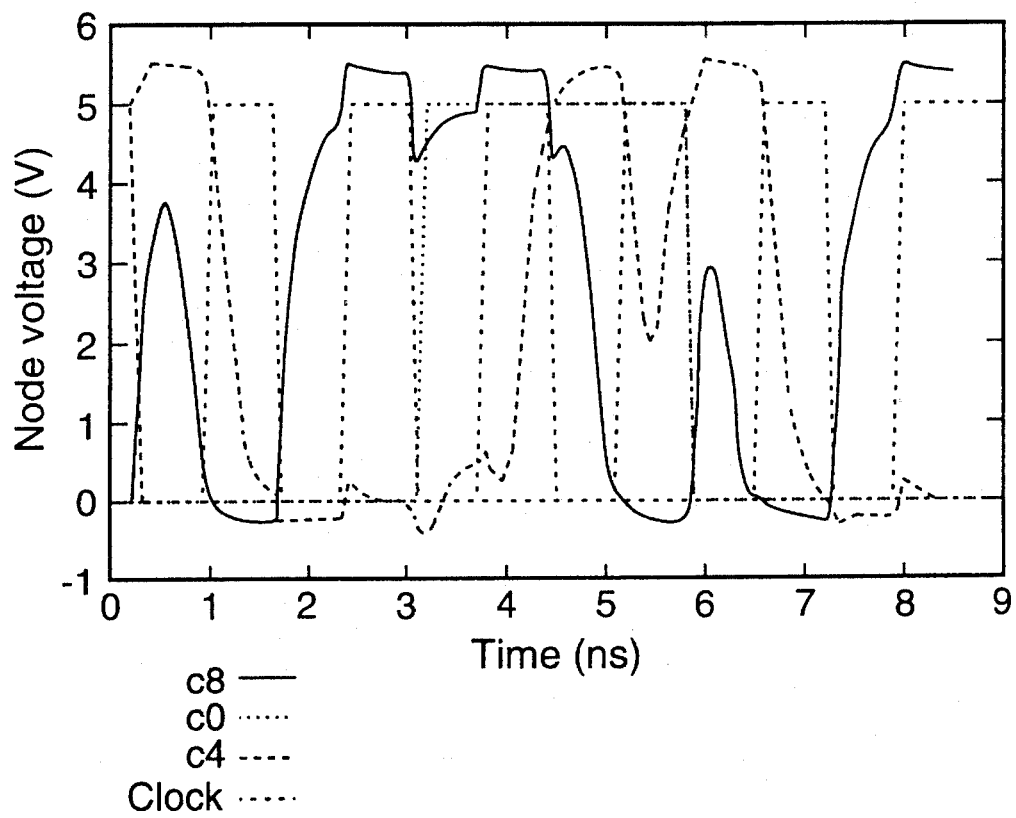
FIG. 19 is a graph showing output voltage levels for the 8-bit carry generator of FIG. 18 at a clock frequency of 714 MHz.
Figure 20:
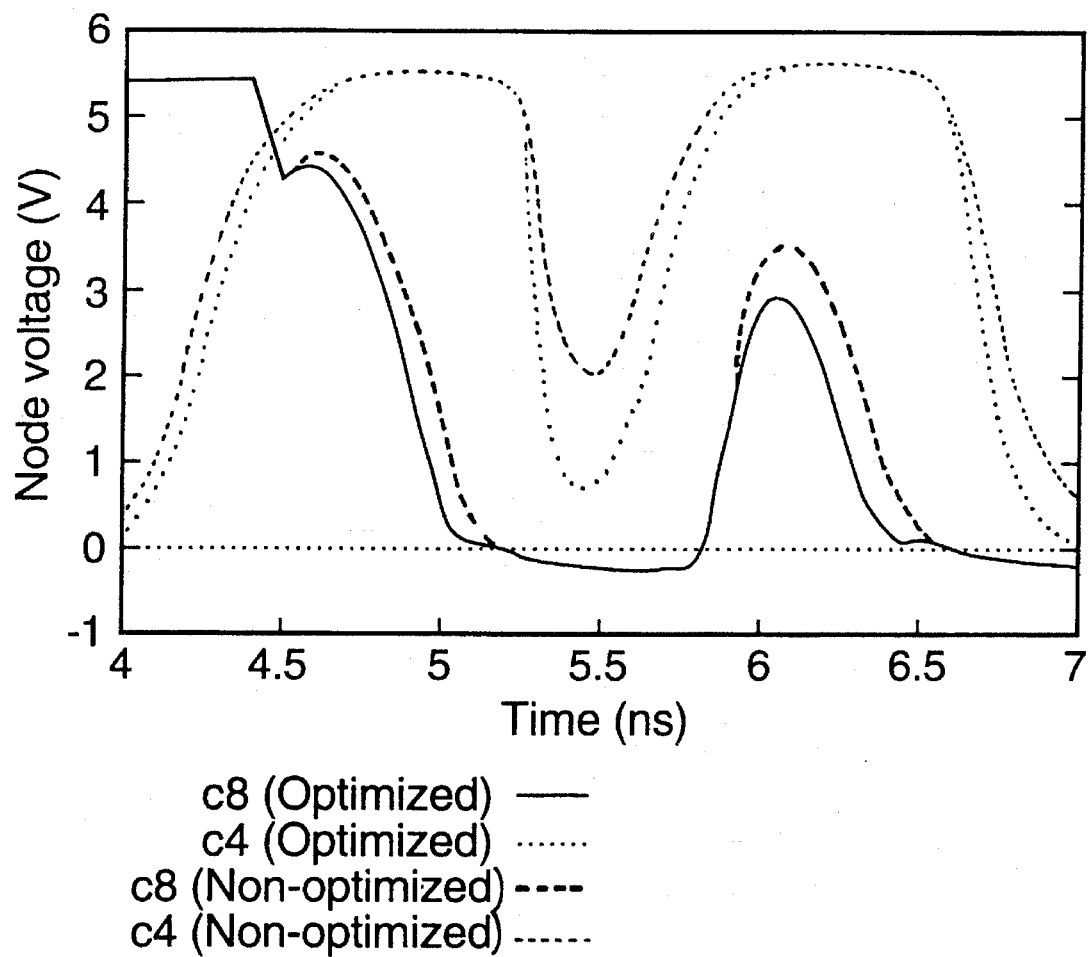
FIG. 20 is a graph showing output voltage levels of the 8-bit carry generator of FIG. 18 with optimized and non-optimized conditions.

The second exemplary embodiment is in the form of an 8-bit carry generator, implemented by the pipelined N1- and N2-blocks, as shown in FIG. 18. This circuit uses five stacked NMOS transistors. The longest delay occurs when the input signal is applied to P3 and all other $P_i=1, G_i=0 (i=1,2,\ldots,7)$ and $c0=1$. The clock signal is constructed as follows: 0.1 ns rise and fall time and 0.6 ns for the holding time. Optimized conditions which are addressed in Tables 2 and 3 are used for the HSPICE simulation. The transient analysis of node waveforms (see FIG. 19) shows that the circuit can operate at a clock frequency of 714 MHz. Another advantage of using the optimized parameters of the latch stages as shown in Tables 2 and 3 is to reduce the amplitude of signal voltage dips. While the output signal of the N1-block is held at $V_{DD}$ for two consecutive clock cycles, the output signal voltage experiences dips because node "a" drops from $V_{DD}$ to $V_{SS}$, during the evaluating period. From FIG. 20, it is seen that the non-optimized latch stages, with $W_{N2,N3}=4$ μm in the N1-block and $W_{P2,P3}=8$ μm in the N2-block, not only are slower bet also are characterized by larger dips. This is because the switching point of the optimized latches of the N1- and N2-blocks shifts upward toward $V_{DD}$ and downward to $V_{SS}$ more than do the non-optimized latches, respectively. Therefore, the latches with the optimized operating conditions switch earlier and thus, have smaller dips than non-optimized circuits.

In summary, the all-N-logic high speed single-phase CMOS dynamic circuits of the present invention are 2 to 3 times faster than conventional prior art circuits. The 2:1 frequency divider of FIG. 16, using the ANL2 embodiment, can operate at a clock frequency of 1.5 GHz using 0.8 μm CMOS technology. The 8-*b* carry generator of FIG. 18, implemented by the pipelined N1- and N2-blocks, has been simulated to operate at a clock frequency of over 710 MHz. These new circuits achieve high speed by avoiding the use of low-speed P-logic blocks. The inventive circuits are race-free and use a single-phase clock. Some common problems related to dynamic circuits, such as dc power, charge redistribution in the evaluating/holding blocks and clock skew rate, are also overcome in the proposed all-N-logic dynamic circuits of this invention.

Alternative embodiments and variations of the invention are possible without departing from the sphere and scope as defined by the claims appended hereto.

We claim:

1. A non-inverting all-N-logic CMOS dynamic circuit connected to positive and negative power rails, for operation in response to receiving a single-phase clock signal, comprising:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to said positive power rail, and said gate terminal being connected to the source terminal of said first PMOS transistor means;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to the drain terminal of said first NMOS transistor, and said gate terminal being connected to the source terminal of said first PMOS transistor;

f) a third PMOS transistor having a gate terminal, a drain terminal and a source terminal, said gate terminal being connected to the source terminal of said first PMOS transistor, said drain terminal being connected to said positive power rail, and said source terminal being connected to the drain terminal of said second NMOS transistor; and g) a third NMOS transistor having a gate terminal, a drain terminal and a source terminal, said source terminal being connected to the source terminal of said third PMOS transistor and the drain terminal of said second NMOS transistor, said gate terminal being connected to said source of said single-phase clock signal, and said drain terminal being connected to the source terminal of said second PMOS transistor and an output terminal.

2. An inverting all-N-logic CMOS dynamic circuit connected to positive and negative power rails, for operation in response to receiving a single-phase clock signal, comprising:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to the source terminal of said first PMOS transistor;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to said negative power rail, and said gate terminal being connected to the drain terminal of said first NMOS transistor;

f) a third PMOS transistor having a gate terminal, a drain terminal and a source terminal, said gate terminal being connected to said source of said single-phase clock signal, said drain terminal being connected to the source terminal of said second PMOS transistor, and said source terminal being connected to the drain terminal of said second NMOS transistor and to an output terminal;

g) a third NMOS transistor having a gate terminal, a drain terminal and a source terminal, said source terminal being connected to said negative power rail, said gate terminal being connected to said drain terminal of said first NMOS transistor, and said drain terminal being connected to the source terminal of said second PMOS transistor and the drain terminal of said third PMOS transistor; and h) a fourth PMOS transistor having a gate terminal, a drain terminal and a source terminal, said source terminal being connected to the gate terminals of said second and third NMOS transistors and the gate terminal of said second PMOS transistor, said gate terminal being connected to the drain terminals of said third NMOS transistor and said third PMOS transistor and to the source terminal of said second PMOS transistor, and said drain terminal being connected to the source terminal of said first PMOS transistor and the drain terminal of said second PMOS transistor.

3. A pipeline system comprising series connected alternating non-inverting and inverting all-N-logic CMOS dynamic circuits, wherein:

I) said non-inverting all-N-logic CMOS dynamic circuits are connected to positive and negative power rails, for operation in response to receiving a single-phase clock signal, and each of said non-inverting all-N-logic CMOS dynamic circuits comprises:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to said positive power rail, and said gate terminal being connected to the source terminal of said first PMOS transistor means;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to the drain terminal of said first NMOS transistor, and said gate terminal being connected to the source terminal of said first PMOS transistor;

f) a third PMOS transistor having a gate terminal, a drain terminal and a source terminal, said gate terminal being connected to the source terminal of said first PMOS transistor, said drain terminal being connected to said positive power rail, and said source terminal being connected to the drain terminal of said second NMOS transistor; and g) a third NMOS transistor having a gate terminal, a drain terminal and a source terminal, said source terminal being connected to the source terminal of said third PMOS transistor and the drain terminal of said second NMOS transistor, said gate terminal being connected to said source of said single-phase clock signal, and said drain terminal being connected to the source terminal of said second PMOS transistor and an output terminal; and wherein II) said inverting all-N-logic CMOS dynamic circuits are connected to positive and negative power rails, for operation in response to receiving a single-phase clock signal, and each of said inverting all-N-logic CMOS dynamic circuits comprises:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to the source terminal of said first PMOS transistor;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to said negative power rail, and said gate terminal being connected to the drain terminal of said first NMOS transistor;

f) a third PMOS transistor having a gate terminal, a drain terminal and a source terminal, said gate terminal being connected to said source of said single-phase clock signal, said drain terminal being connected to the source terminal of said second PMOS transistor, and said source terminal being connected to the drain terminal of said second NMOS transistor and to an output terminal;

g) a third NMOS transistor having a gate terminal, a drain terminal and a source terminal, said source terminal being connected to said negative power rail, said gate terminal being connected to said drain terminal of said first NMOS transistor, and said drain terminal being connected to the source terminal of said second PMOS transistor and the drain terminal of said third PMOS transistor; and h) a fourth PMOS transistor having a gate terminal, a drain terminal and a source terminal, said source terminal being connected to the gate terminals of said second and third NMOS transistors and the gate terminal of said second PMOS transistor, said gate terminal being connected to the drain terminals of said third NMOS transistor and said third PMOS transistor and to the source terminal of said second PMOS transistor, and said drain terminal being connected to the source terminal of said first PMOS transistor and the drain terminal of said second PMOS transistor.

4. A non-inverting all-N-logic CMOS dynamic circuit connected to positive and negative power rails, for operation in response to receiving a single-phase clock signal, comprising:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to said positive power rail, and said gate terminal being connected to the source terminal of said first PMOS transistor means;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to said negative power rail, and said gate terminal being connected to the source terminal of said first PMOS transistor;

f) a third PMOS transistor having a gate terminal, a drain terminal and a source terminal, said gate terminal being connected to the source terminal of said first PMOS transistor, said drain terminal being connected to said positive power rail, and said source terminal being connected to the drain terminal of said second NMOS transistor; and g) a third NMOS transistor having a gate terminal, a drain terminal and a source terminal, said source terminal being connected to the source terminal of said third PMOS transistor and the drain terminal of said second NMOS transistor, said gate terminal being connected to said source of said single-phase clock signal, and said drain terminal being connected to the source terminal of said second PMOS transistor and an output terminal.

5. An inverting all-N-logic CMOS dynamic circuit connected to positive and negative power rafts, for operation in response to receiving a single-phase clock signal, comprising:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to said positive power rail;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to said negative power rail, and said gate terminal being connected to the drain terminal of said first NMOS transistor;

f) a third PMOS transistor having a gate terminal, a drain terminal and a source terminal, said gate terminal being connected to said source of said single-phase clock signal, said drain terminal being connected to the source terminal of said second PMOS transistor, and said source terminal being connected to the drain terminal of said second NMOS transistor and to an output terminal;

g) a third NMOS transistor having a gate terminal, a drain terminal and a source terminal, said source terminal being connected to said negative power raft, said gate terminal being connected to said drain terminal of said first NMOS transistor, and said drain terminal being connected to the source terminal of said second PMOS transistor and the drain terminal of said third PMOS transistor; and h) a fourth PMOS transistor having a gate terminal, a drain terminal and a source terminal, said source terminal being connected to the gate terminals of said second and third NMOS transistors and the gate terminal of said second PMOS transistor, said gate terminal being connected to the drain terminals of said third NMOS transistor and said third PMOS transistor and to the source terminal of said second PMOS transistor, and said drain terminal being connected to the source terminal of said first PMOS transistor.

6. A pipeline system comprising series connected alternating non-inverting and inverting all-N-logic CMOS dynamic circuits, wherein:

I) said non-inverting all-N-logic CMOS dynamic circuits are connected to positive and negative power rails, for operation in response to receiving a single-phase clock signal, and each of said non-inverting all-N-logic CMOS dynamic circuits comprises:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to said positive power rail, and said gate terminal being connected to the source terminal of said first PMOS transistor means;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to said negative power rail, and said gate terminal being connected to the source terminal of said first PMOS transistor;

f) a third PMOS transistor having a gate terminal, a drain terminal and a source terminal, said gate terminal being connected to the source terminal of said first PMOS transistor, said drain terminal being connected to said positive power rail, and said source terminal being connected to the drain terminal of said second NMOS transistor; and g) a third NMOS transistor having a gate terminal, a drain terminal and a source terminal, said source terminal being connected to the source terminal of said third PMOS transistor and the drain terminal of said second NMOS transistor, said gate terminal being connected to said source of said single-phase clock signal, and said drain terminal being connected to the source terminal of said second PMOS transistor and an output terminal; and wherein II) said inverting all-N-logic CMOS dynamic circuits are connected to positive and negative power rails, for operation in response to receiving a single-phase clock signal, and each of said inverting all-N-logic CMOS dynamic circuits comprises:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to said positive power rail;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to said negative power rail, and said gate terminal being connected to the drain terminal of said first NMOS transistor;

f) a third PMOS transistor having a gate terminal, a drain terminal and a source terminal, said gate terminal being connected to said source of said single-phase clock signal, said drain terminal being connected to the source terminal of said second PMOS transistor, and said source terminal being connected to the drain terminal of said second NMOS transistor and to an output terminal;

g) a third NMOS transistor having a gate terminal, a drain terminal and a source terminal, said source terminal being connected to said negative power rail, said gate terminal being connected to said drain terminal of said first NMOS transistor, and said drain terminal being connected to the source terminal of said second PMOS transistor and the drain terminal of said third PMOS transistor; and h) a fourth PMOS transistor having a gate terminal, a drain terminal and a source terminal, said source terminal being connected to the gate terminals of said second and third NMOS transistors and the gate terminal of said second PMOS transistor, said gate terminal being connected to the drain terminals of said third NMOS transistor and said third PMOS transistor and to the source terminal of said second PMOS transistor, and said drain terminal being connected to the source terminal of said first PMOS transistor.

7. An inverting all-N-logic CMOS dynamic circuit connected to positive and negative power rails, for operation in response to receiving a single-phase clock signal, comprising:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to the source terminal of said first PMOS transistor;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to said negative power rail, and said gate terminal being connected to the drain terminal of said first NMOS transistor;

f) a third PMOS transistor having a gate terminal, a drain terminal and a source terminal, said gate terminal being connected to said source of said single-phase clock signal, said drain terminal being connected to the source terminal of said second PMOS transistor, and said source terminal being connected to the drain terminal of said second NMOS transistor and to an output terminal; and g) a fourth PMOS transistor having a gate terminal, a drain terminal and a source terminal, said source terminal being connected to the gate terminals of said second NMOS and PMOS transistors, said gate terminal being connected to the drain terminal of said third PMOS transistor and to the source terminal of said second PMOS transistor, and said drain terminal being connected to the source terminal of said first PMOS transistor and the drain terminal of said second PMOS transistor.

8. An inverting all-N-logic CMOS dynamic circuit connected to positive and negative power rails, for operation in response to receiving a single-phase clock signal, comprising:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to said positive power rail;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to said negative power rail, and said gate terminal being connected to the drain terminal of said first NMOS transistor;

f) a third PMOS transistor having a gate terminal, a drain terminal and a source terminal, said gate terminal being connected to said source of said single-phase clock signal, said drain terminal being connected to the source terminal of said second PMOS transistor, and said source terminal being connected to the drain terminal of said second NMOS transistor and to an output terminal; and g) a fourth PMOS transistor having a gate terminal, a drain terminal and a source terminal, said source terminal being connected to the gate terminals of said second NMOS and PMOS transistors, said gate terminal being connected to the drain terminal of said third PMOS transistor and to the source terminal of said second PMOS transistor, and said drain terminal being connected to the source terminal of said first PMOS transistor.

9. A pipeline system comprising series connected alternating non-inverting and inverting all-N-logic CMOS dynamic circuits, wherein:

I) said non-inverting all-N-logic CMOS dynamic circuits are connected to positive and negative power rails, for operation in response to receiving a single-phase clock signal, and each of said non-inverting all-N-logic CMOS dynamic circuits comprises:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to said positive power rail, and said gate terminal being connected to the source terminal of said first PMOS transistor means;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to the drain terminal of said first NMOS transistor, and said gate terminal being connected to the source terminal of said first PMOS transistor;

f) a third NMOS transistor having a gate terminal, a drain terminal and a source terminal, said source terminal being connected to the source terminal of said third PMOS transistor and the drain terminal of said second NMOS transistor, said gate terminal being connected to said source of said single-phase clock signal, and said drain terminal being connected to the source terminal of said second PMOS transistor and an output terminal;

and wherein

II) said inverting all-N-logic CMOS dynamic circuits are connected to positive and negative power rails, for operation in response to receiving a single-phase clock signal, and each of said inverting all-N-logic CMOS dynamic circuits comprises:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to the source terminal of said first PMOS transistor;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to said negative power rail, and said gate terminal being connected to the drain terminal of said first NMOS transistor;

f) a third PMOS transistor having a gate terminal, a drain terminal and a source terminal, said gate terminal being connected to said source of said single-phase clock signal, said drain terminal being connected to the source terminal of said second PMOS transistor, and said source terminal being connected to the drain terminal of said second NMOS transistor and to an output terminal;and g) a fourth PMOS transistor having a gate terminal, a drain terminal and a source terminal, said source terminal being connected to the gate terminals of said second NMOS and PMOS transistors, said gate terminal being connected to the drain terminal of said third PMOS transistor and to the source terminal of said second PMOS transistor, and said drain terminal being connected to the source terminal of said first PMOS transistor and the drain terminal of said second PMOS transistor.

10. A pipeline system comprising series connected alternating non-inverting and inverting all-N-logic CMOS dynamic circuits, wherein:

I) said non-inverting all-N-logic CMOS dynamic circuits are connected to positive and negative power rails, for operation in response to receiving a single-phase clock signal, and each of said non-inverting all-N-logic CMOS dynamic circuits comprises:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to said positive power rail, and said gate terminal being connected to the source terminal of said first PMOS transistor means;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to said negative power rail, and said gate terminal being connected to the source terminal of said first PMOS transistor;

f) a third NMOS transistor having a gate terminal, a drain terminal and a source terminal, said source terminal being connected to the source terminal of said third PMOS transistor and the drain terminal of said second NMOS transistor, said gate terminal being connected to said source of said single-phase clock signal, and said drain terminal being connected to the source terminal of said second PMOS transistor and an output terminal; and wherein II) said inverting all-N-logic CMOS dynamic circuits are connected to positive and negative power rails, for operation in response to receiving a single-phase clock signal, and each of said inverting all-N-logic CMOS dynamic circuits comprises:

a) a first PMOS transistor having a gate terminal, a drain terminal and a source terminal, said drain terminal being connected to said positive power rail, and said gate terminal being connected to a source of said single-phase clock signal;

b) a second PMOS transistor having a gate terminal, a drain terminal and a source terminal, said drain terminal being connected to said positive power rail;

c) a first NMOS transistor having a gate terminal, a drain terminal and a source terminal, said source terminal being connected to said negative power rail, and said gate terminal being connected to said source of said single-phase clock signal;

d) N logic switch means connected to the source terminal of said first PMOS transistor and the drain terminal of said first NMOS transistor, for selectively connecting and disconnecting said source terminal of said first PMOS transistor and said drain terminal of said first NMOS transistor;

e) a second NMOS transistor having a gate terminal, a drain terminal and a source terminal, said source terminal being connected to said negative power rail, and said gate terminal being connected to the drain terminal of said first NMOS transistor;

f) a third PMOS transistor having a gate terminal, a drain terminal and a source terminal, said gate terminal being connected to said source of said single-phase clock signal, said drain terminal being connected to the source terminal of said second PMOS transistor, and said source terminal being connected to the drain terminal of said second NMOS transistor and to an output terminal; and g) a fourth PMOS transistor having a gate terminal, a drain terminal and a source terminal, said source terminal being connected to the gate terminals of said second NMOS and PMOS transistors, said gate terminal being connected to the drain terminal of said third PMOS transistor and to the source terminal of said second PMOS transistor, and said drain terminal being connected to the source terminal of said first PMOS transistor.

11. The dynamic circuit according to any one of claims 1, 2, 4, 5, 7 or 8, wherein said N logic switch means comprises at least one further NMOS transistor.

12. The pipeline system of any one of claims 3, 6, 9 or 10, wherein said N logic switch means comprises at least one further NMOS transistor.

13. The pipeline system of any one of claims 3, 6, 9 or 10, further comprising a CMOS gate intermediate each successive pair of said inverting and non-inverting all-N-logic CMOS dynamic circuits.

* * * * *